(12) United States Patent
Fann et al.

(10) Patent No.: US 9,064,772 B2
(45) Date of Patent: Jun. 23, 2015

(54) TOUCH SCREEN SYSTEM HAVING DUAL TOUCH SENSING FUNCTION

(75) Inventors: Sen-Shyong Fann, Taipei County (TW); Nae-Jye Hwang, Hsinchu (TW); Shen-Tai Liaw, Hsinchu (TW); Feng-Sheng Lin, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 1024 days.

(21) Appl. No.: 12/897,765

(22) Filed: Oct. 4, 2010
(Under 37 CFR 1.47)

(65) Prior Publication Data
US 2011/0018840 A1 Jan. 27, 2011

Related U.S. Application Data

(60) Continuation-in-part of application No. 12/406,337, filed on Mar. 18, 2009, now Pat. No. 7,935,917, which is a division of application No. 11/534,680, filed on Sep. 25, 2006, now Pat. No. 7,525,078.

(30) Foreign Application Priority Data

Oct. 7, 2005 (TW) .............................. 94135169 A

(51) Int. Cl.
*G06M 7/00* (2006.01)
*G06F 3/041* (2006.01)
(Continued)

(52) U.S. Cl.
CPC ........ *H01L 27/14681* (2013.01); *G06F 3/0412* (2013.01); *G06F 3/042* (2013.01); *G06F 3/044* (2013.01); *G06F 3/045* (2013.01)

(58) Field of Classification Search
CPC . G06F 3/0487; G06F 3/0488; G06F 3/04883; G06F 3/04886; G06F 3/0489; G06F 3/04892; G06F 3/04895; G06F 3/04897; G06F 3/041; G06F 3/0412; G06F 3/0414; G06F 3/0416; G06F 3/042; G06F 3/0421; G06F 3/0423; G06F 3/0425; G06F 3/0426; G06F 3/043; G06F 3/044; G06F 3/045; G06F 3/046; G06F 3/047; G06F 2203/04101; G06F 2203/04104; G06F 2203/04105; G06F 2203/04106; G06F 2203/04108; G06F 2203/04109; G06F 2203/04807

USPC ................ 200/512, 517, 520–522, 530, 532; 340/407.1, 407.2; 178/18.01–18.09, 178/18.11, 19.01–19.06, 20.01; 250/221, 250/227.11, 227.13, 227.14, 227.18, 227.2, 250/227.21, 227.22, 227.23, 227.24, 250/227.31, 227.32
See application file for complete search history.

(56) References Cited

U.S. PATENT DOCUMENTS 4,684,801 A 8/1987 Carroll et al.
4,686,332 A 8/1987 Greanias et al.
(Continued)

FOREIGN PATENT DOCUMENTS

CN 101167042 4/2008
EP 0679869 11/1995
(Continued)

OTHER PUBLICATIONS

Abileah et al., "Integrated Optical Touch Panel in a 14.1" AML CD", SID 04 Digest (2004), 59.3, 1544-1547, OR, USA.
(Continued)

*Primary Examiner* — Pascal M Bui Pho
(74) *Attorney, Agent, or Firm* — Jianq Chyun IP Office

(57) ABSTRACT

A touch screen system includes an in-cell type optical touch device for displaying images and receiving a light signal, an out-cell type touch device for sensing a finger or a non-optical stylus, a first functional unit connected with the in-cell type optical touch device, a second functional unit connected with the out-cell type touch panel and a third functional unit connected with the first functional unit and the second functional unit. The out-cell type touch device is disposed on the in-cell type optical touch device. The first functional unit converts an analog sensing signal received by the in-cell type optical touch device into a first electrical signal. An object-sensing signal generated from the out-cell type touch panel is processed by the second functional unit to generate a second electrical signal. The third functional unit analyzes the first electrical signal and the second electrical signal and generates valid output signals.

13 Claims, 2 Drawing Sheets

(51) Int. Cl.
*G06F 3/043* (2006.01)
*H01L 27/146* (2006.01)
*G06F 3/042* (2006.01)
*G06F 3/044* (2006.01)
*G06F 3/045* (2006.01)

(56) References Cited

U.S. PATENT DOCUMENTS

| | | | |
|---|---|---|---|
| 4,988,983 | A | 1/1991 | Wehrer |
| 5,231,381 | A | 7/1993 | Duwaer |
| 5,262,635 | A | 11/1993 | Curbelo |
| 5,543,589 | A | 8/1996 | Buchana et al. |
| 5,670,755 | A | 9/1997 | Kwon |
| 5,705,807 | A | 1/1998 | Throngnumchai et al. |
| 5,777,607 | A | 7/1998 | Koolen |
| 5,815,141 | A | 9/1998 | Phares |
| 5,956,020 | A | 9/1999 | D'Amico et al. |
| 6,046,466 | A | 4/2000 | Ishida et al. |
| 6,081,558 | A | 6/2000 | North |
| 6,350,981 | B1 | 2/2002 | Uno |
| 6,492,979 | B1 | 12/2002 | Kent et al. |
| 6,504,530 | B1 * | 1/2003 | Wilson et al. ............... 345/173 |
| 6,512,547 | B1 | 1/2003 | Miida |
| 6,747,290 | B2 * | 6/2004 | Yamazaki et al. ............ 257/59 |
| 6,762,752 | B2 | 7/2004 | Perski et al. |
| 6,947,102 | B2 | 9/2005 | den Boer et al. |
| 7,002,547 | B2 | 2/2006 | Yamada |
| 7,030,360 | B2 | 4/2006 | Shimizu et al. |
| 7,166,966 | B2 * | 1/2007 | Naugler et al. ............... 315/149 |
| 7,184,009 | B2 | 2/2007 | Bergquist |
| 7,298,367 | B2 * | 11/2007 | Geaghan et al. ............. 345/180 |
| 7,312,784 | B2 | 12/2007 | Baucom et al. |
| 2003/0111604 | A1 | 6/2003 | Quek |
| 2003/0156087 | A1 | 8/2003 | Boer et al. |
| 2003/0156100 | A1 * | 8/2003 | Gettemy ....................... 345/204 |
| 2003/0156230 | A1 | 8/2003 | Boer et al. |
| 2003/0218116 | A1 | 11/2003 | Boer |
| 2005/0200296 | A1 | 9/2005 | Naugler, Jr. et al. |
| 2006/0138983 | A1 | 6/2006 | Lee et al. |
| 2006/0262055 | A1 | 11/2006 | Takahara |
| 2006/0274056 | A1 | 12/2006 | Saravanan et al. |
| 2007/0257890 | A1 | 11/2007 | Hotelling et al. |
| 2008/0042992 | A1 | 2/2008 | Kim |
| 2009/0152023 | A1 | 6/2009 | Yeh et al. |
| 2010/0101872 | A1 | 4/2010 | Ikeda et al. |
| 2010/0171716 | A1 | 7/2010 | Ikeda et al. |

FOREIGN PATENT DOCUMENTS

| | | |
|---|---|---|
| EP | 1195576 | 6/2008 |
| JP | 4013360 | 1/1992 |
| JP | 06-011645 | 1/1994 |
| JP | 2000-162041 | 6/2000 |
| KR | 2001-0004005 | 1/2001 |
| TW | 200905537 | 2/2009 |
| TW | 200941314 | 10/2009 |
| TW | M371273 | 12/2009 |
| TW | 201035835 | 10/2010 |

OTHER PUBLICATIONS

Destura et al. "Novel Touch Sensitibe In-Cell AMLCD", SID 04 Digest (2004), 3.5, 22-23, Philips Researches of the Netherlans and United Kingdom.

"Office Action of Taiwan Counterpart Application", issued on Mar. 21, 2014, p. 1-p. 4.

* cited by examiner

TOUCH SCREEN SYSTEM HAVING DUAL TOUCH SENSING FUNCTION

CROSS-REFERENCE TO RELATED APPLICATION

This application is a continuation-in-part (CIP) application, of and claims the priority benefit of patent application Ser. No. 12/406,337, filed on Mar. 18, 2009, now allowed. The prior patent application Ser. No. 12/406,337 is a divisional application of and claims the priority benefit of patent application Ser. No. 11/534,680, filed on Sep. 25, 2006, which has been patented as U.S. Pat. No. 7,525,078 on Apr. 28, 2009. The prior patent application Ser. No. 11/534,680 also claims the priority benefit of Taiwan application No. 94135169, filed on Oct. 7, 2005. The entirety of each of the above-mentioned applications is hereby incorporated by reference herein and made a part of this specification.

BACKGROUND OF THE INVENTION

1. Field of the Invention

The present invention generally relates to an interactive display panel. More particularly, the present invention relates to an interactive display panel having dual touch-sensing function.

2. Description of Related Art

Display panels traditionally serve the role of displaying the information or the output from a system, while other input device or devices provide inputs to the system. Interactive devices, such as a touch panel that can receive an user's input via touching the display panel, combines both output and input functions and allow an user to interact with the display or the system coupled to the display. As an example, devices such as personal digital assistants (PDAs), mobile phones, personal computers (PCs), tablet PCs, etc. have incorporated touch panels for providing users with more input choices.

Conventional touch panels or touch screens have a number of different designs, such as resistive type, surface-acoustic wave type, capacitive type, and infrared-ray type designs. All of these designs typically require combining a display device with a separate touch panel sheet. The resistive type, surface-acoustic wave type, capacitive type, and infrared-ray type touch panel are operated by users' fingers or stylus. The in-cell type optical touch display panel includes a display panel, a plurality of photo-sensors arranged in array, a plurality of scan lines, and a plurality of readout lines. The photo-sensors, the scan lines, and the readout lines are integrated within the display panel. Usually, the photo-sensors are suitable for receiving optical signal from an optical stylus. The scan lines and the readout lines are electrically connected with the photo-sensors such that the photo-sensors are sequentially turned on through the scan lines and the photo-current generated from the photo-sensors are transmitted to a touch sensing IC through the readout lines.

Accordingly, a desired touch panel that have advantages of the in-cell touch and the out-cell touch but excluded the drawback of the both is necessary. Meanwhile, the touch panel is almost produced by a conventional LCD screen and not significantly increase the complexity of the manufacture.

SUMMARY OF THE INVENTION

The present application is to provide an interactive display panel having dual touch-sensing function.

As embodied and broadly described herein, the present application provides a touch screen system including an in-cell type optical touch device for displaying images and receiving a light signal, an out-cell type touch device for sensing a finger or a non-optical stylus, a first functional unit electrically connected with the in-cell type optical touch device, a second functional unit electrically connected with the out-cell type touch panel and a third functional unit electrically connected with the first functional unit and the second functional unit. The out-cell type touch device is disposed on an outer surface of the in-cell type optical touch device. The first functional unit converts an analog sensing signal received by the in-cell type optical touch device into a first electrical signal. An object-sensing signal generated from the out-cell type touch panel is processed by the second functional unit to generate a second electrical signal. The third functional unit analyzes the first electrical signal and the second electrical signal and generates valid output signals, wherein the valid output signals include both a light spot location and an object touch location detected by the touch screen system.

Examples of the present application provide a touch screen system including a display device, a plurality of optical sensors, a processor, an object-sensing device and a controller. The display device has a plurality of pixel electrodes disposed in a display area. The plurality of optical sensors are disposed in a matrix of pixel electrodes, which are activated by an optical signal and driven by a signal line of the pixel electrode to convert the optical signal into a raw current signal. The processor is capable of determining a light spot location based on the activated optical sensor and generating a first electrical signal based on the raw current signal. The object-sensing device is capable of responsive to a touch implement on the display area and generating a second electrical signal with a set of position coordinates of the touch implement. The controller compares the first electrical signal and the second electrical signal to determine whether the first electrical signal or the second electrical signal as an output signal.

Examples of the present application also provide a touch screen system including a light pen, a monitor and an operator. The light pen has optical source for providing a light. The monitor senses at least one of the light and a stylus impinging on a display area, the monitor provides a output representative of one location of the light or the stylus on the display area. The operator is configured to process a first electrical signal converted from light and a second electrical signal sensed from stylus, and the operator generates a set of position coordinates associated with the first electrical signal prior to the second electrical signal. Since the operator outputs an output signal corresponding to the touch-sensing signal from the in-cell type optical touch display panel or the touch-sensing signal from the out-cell type touch panel according to whether the touch-sensing signal from the in-cell type optical touch display panel is received by the first functional unit or not, it is more convenient that users can operate the interactive display by fingers and by optical stylus.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
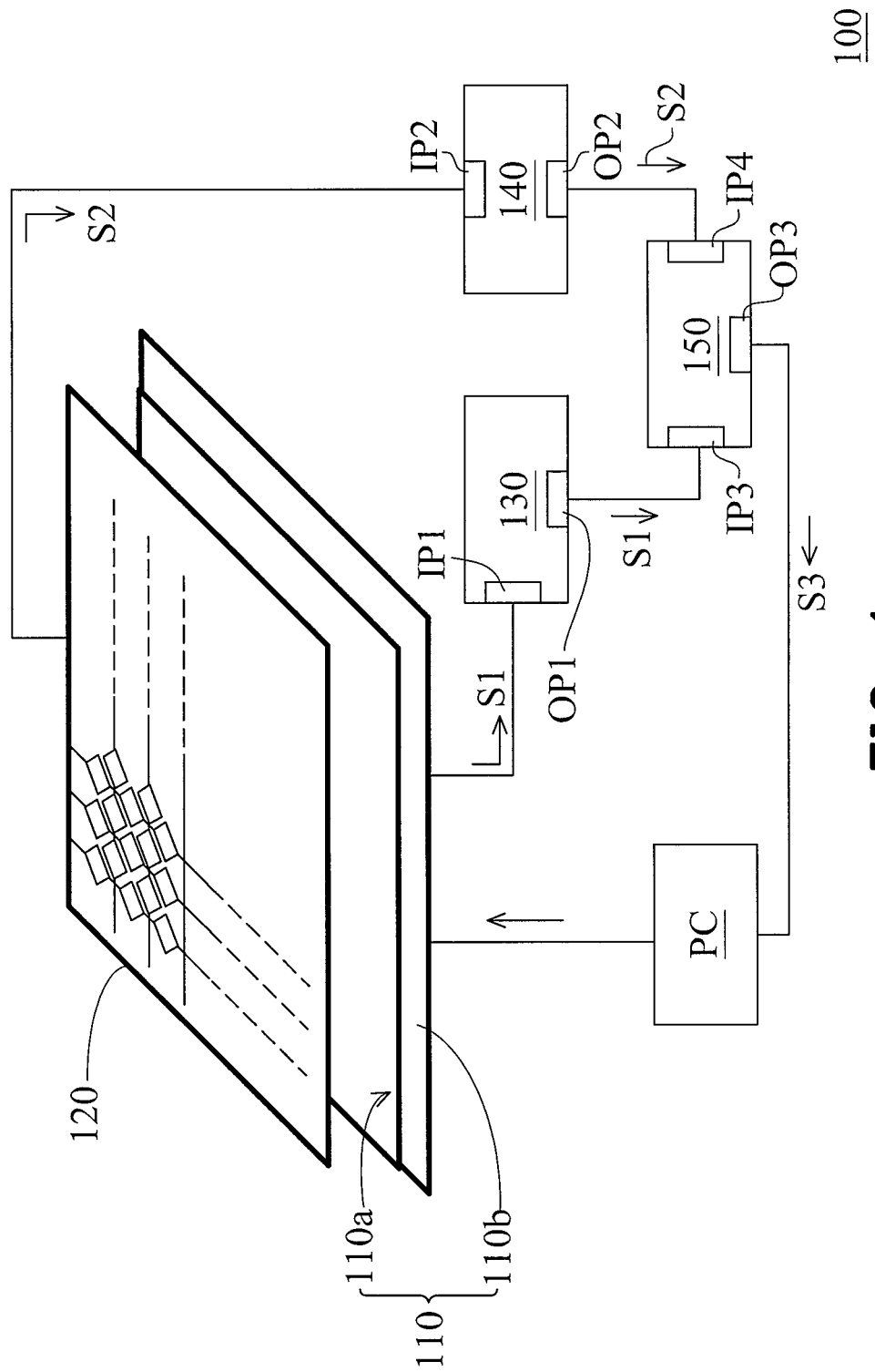
FIG. 1 is a schematic diagram illustrating an interactive display panel according to an embodiment of the present application.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram illustrating an interactive display panel according to an embodiment of the present application. Referring to FIG. 1, a touch screen system 100 of the present embodiment includes an in-cell type optical touch device 110, an out-cell type touch device 120 disposed on an outer surface of the display panel 110, a first functional unit 130 electrically connected with the in-cell type optical touch device 110, a second functional unit 140 electrically connected with the out-cell type touch device 120, and a third functional unit 150 is electrically connected to the first functional unit 130 and the second functional unit 140. The in-cell type optical touch device 110 may be an in-cell type optical touch liquid crystal display panel. The out-cell type touch device 120 is, for example, a capacitive or resistive sensing film laminated on the in-cell type optical touch device 110. The liquid crystal display includes a plurality of layers, most basically, a top glass substrate 110a, a liquid crystal (not shown), and a bottom glass substrate 110b. The top glass substrate 110a and bottom glass substrates 110b can be patterned to provide a driving power for a particular pixel transistor, and also provide a sensing function for detecting optical input from light pen.

The in-cell type optical touch liquid crystal display panel 110 may be defined as a liquid crystal display panel having a plurality of in-cell type optical touch-sensing electrodes built therein. Specially, optical touch-sensing electrodes can be integrated between the two glass substrates, and driven by a signal line of the pixel electrodes. Certainly, the in-cell type optical touch device 110 of the present application may be other flat display panel having in-cell type optical touch-sensing circuit built therein. As described in the applications incorporated by reference, a plurality of optical touch-sensing electrodes are disposed in a matrix of pixel electrodes, and fabricated with the pixel electrodes in the same fabrication. The optical touch-sensing electrodes are activated by an optical signal from a light pen, when the light pen is exerted against the display device. As mentioned above, in the presence of an optical signal imposed on a display surface, an analog signal converted from the optical signal is translated into a digital first touch sensing signal S1 by the first functional unit 130, and the first touch sensing signal S1 is then transmitted to the third functional unit 150.

The first functional unit 130 has a first input port IP1 and a first output port OP1. The second functional unit 140 has a second input port IP2 and a second output port OP2. The third functional unit 150 has a third input port IP3, a fourth input port IP4 and a third output port OP3. The first input port IP1 and the second input port IP2 are respectively connected with the in-cell type optical touch device 110 and the out-cell type touch device 120. The first output port OP1 and the second output port OP2 are respectively connected with the third input port IP3 and the fourth input port IP4.

The out-cell type touch device 120 including a finger-sensing foil laminated to the liquid crystal panel or other flat display panel, and responsive to non-optical sensing signal from a finger or other capacitive object. The out-cell type touch device 120 is, for example, but not limited to, resistive type touch panel or a capacitive type touch panel, in which a value of voltage or current is formed at the touch location of the out-cell type touch device 120, and processed by a second functional unit 140 to generate a touch sensing signal S2 to a third functional unit 150. The out-cell type touch device 120 does not always cover all the display surface of the in-cell type optical touch device 110, it may be configured as an emitter and a detector adhered on the outer surface of the in-cell type optical touch device 110, such as a surface-wave type touch panel, an electromagnetic type touch panel or an infrared-ray type touch panel. Alternatively, the out-cell type touch device 120 might be a camera-based touch screen system, in which cameras are arranged in the corner of the in-cell type optical touch device 110 display surface to detect image to determine the touch location. Additionally, although many of the disclosed touch screen technology or in-cell touch screen related to single-touch display, many of the teaching are applied to multi-touch capable arrangements as well.

The first functional unit 130, the second functional unit 140 and a third functional unit 150 is, for example, but not limited to, an application specific integrated circuit (ASIC), a microcontroller unit (MCU) or other logic device. The first functional unit 130 can be a processor, wherein the processor is capable of determining a light spot location based on the activated optical sensor and generating a first touch sensing signal S1 based on the raw current signal. The first touch sensing signal S1 is determined by comparing a current difference between the light spot location on the display area and the other location of the display area, such as any corner of the display device.

The second functional unit 140 is directly connected to the out-cell type touch device 120, and was regarded as an object-sensing device. The object-sensing device is capable of responsive to a touch implement on the display area and generating a second electrical signal with a set of position coordinates of the touch implement.

The third functional unit 150 can be a controller, wherein the controller is suitable for comparing the first touch sensing signal S1 and the second touch sensing signal S2 to determine whether the first touch sensing signal S1 or the second touch sensing signal S2 as an output signal. The controller generates a set of position coordinates associated with the first electrical signal prior to the second electrical signal when the first and the second electrical signal are received simultaneously.

In one embodiment of the present application, the first function unit 130, the second function unit 140, and the third function unit 150 are configured in three different logic devices, referring to FIG. 1. The third functional unit 150, it receives the touch-sensing signal S1 from the in-cell type optical touch device 110 and/or the touch-sensing signal S2 from the out-cell type touch device 120. In an embodiment of the present application, the third functional unit 150 outputs an output signal S3 converted from the touch-sensing signal S1 when the third functional unit 150 only received optical input or the touch screen system in optical type remote operating mode. In another embodiment, the third functional unit 150 outputs an output signal S3 converted from the touch-sensing signal S2 when the third functional unit 150 only received non-optical input or the touch screen system in touch operating mode. In still another embodiment, the third functional unit 150 outputs an valid output signal S3 converted from the touch-sensing signal S1 prior to the touch-sensing signal S2 when both a light spot location form the touch-sensing signal S1 and an object touch location from the touch-sensing signal S2 are inputted on the screen of the touch screen system 100 and received by the third functional unit 150 simultaneously. In yet other embodiments, the third functional unit 150 is designed to ignore the touch-sensing signal S2 for the duration of a light pen lifted off the display surface when the user's hand is resting on the display surface while writing. For achieving this aim of the palm rejection, the third functional unit 150 is capable of computing the occupied area or duration time of the total touch-sensing signal S2, and determining to enhance the touch-sensing signal S1 when the user's hand is placed upon the screen of the touch screen system 100 while writing.

In a preferred embodiment of the present application, the first functional unit 130 is capable of computing and judging. For example, the first function unit 130 and the third function unit 150 are configured in a first logic device and the second functional unit 140 is configured in a second logic device. In some cases, the first functional unit 130, the second functional unit 140 and the third functional unit 150 are configured in the same component, such as an operator, and process a first electrical signal converted from light and a second electrical signal sensed from stylus, and the operator generates a set of position coordinates associated with the first electrical signal prior to the second electrical signal.

Figure 2:
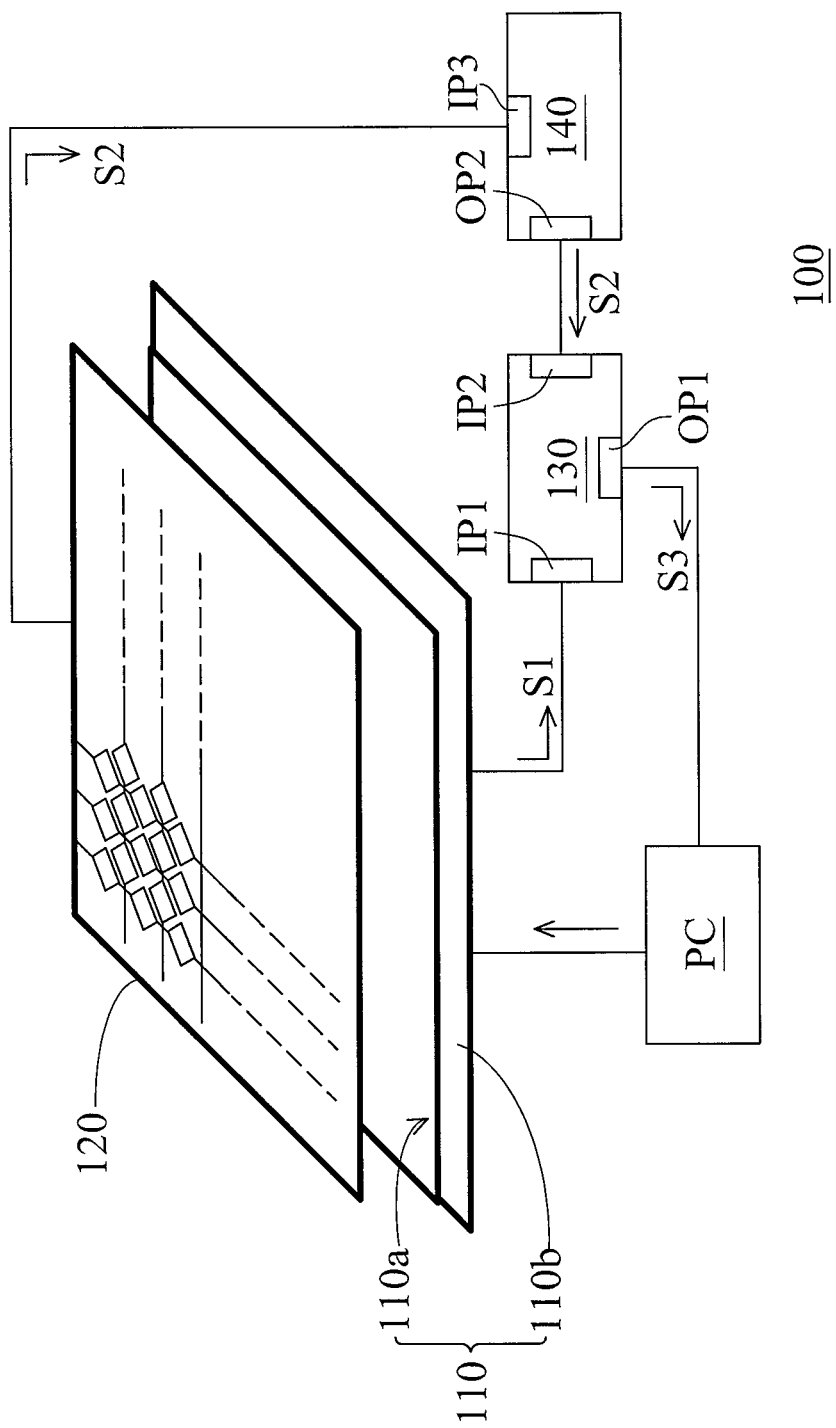
FIG. 2 is a schematic diagram illustrating an interactive display panel according to another embodiment of the present application.

FIG. 2 is a schematic diagram illustrating a monitor composed of the in-cell type optical touch device 110 and the out-cell type touch device 120. The monitor is suitable for sensing a light provided by a light pen and a stylus impinging on a display area, wherein the light is, for example, launched from the light pen when the pen is exerted against the display area. The monitor provides an output representative of one location of the light or the stylus on the display area. The monitor, for example, has an addressable pixel array in a first substrate, and a plurality of optical sensors arranged in the addressable pixel array, wherein the optical sensor is driven by a scan line which is associated with the pixel structures. In addition, the monitor, for example, includes a first substrate, a second substrate and an electro-optic medium disposed between the first substrate and the second substrate. Further, the monitor, for example, includes at least one detector selected from one of a resistive type touch panel, a surface-wave type touch panel, a capacitive type touch panel or an electromagnetic type touch panel.

The first functional unit 130 at least has a first input port IP1 electrically connected with the in-cell type optical touch device 110, a second input port IP2, and a first output port OP1, while the second functional unit 140 at least has a third input port IP3 electrically connected with the out-cell type touch device 120 and a second output port OP2 electrically connected with the second input port IP2 of the first functional unit 130. For example, the first functional unit 130 is an application specific integrated circuit (ASIC), while the second functional unit 140 is an ASIC also. The configuration of the first functional unit 130 and the second functional unit 140 is not limited in this application. The first functional unit 130 and the second functional unit 140 may be further integrated and fabricated within a single ASIC having the first input port IP1, the second input port IP2 and the first output port OP1.

When the interactive display panel 100 is physically touched through an optical stylus capable of emitting light that can be sensed by the out-cell type touch device 120, the touch-sensing signal S1 and the touch-sensing signal S2 are generated and transmitted to the first functional unit 130 and the second functional unit 140, respectively. The touch-sensing signal S1 is inputted to the first functional unit 130 from the first input port IP1 and the touch-sensing signal S2 is inputted to the second functional unit 140 from the third input port IP3. Under this condition, the first functional unit 130 receives the touch-sensing signal S1 from the in-cell type optical touch device 110 and the touch-sensing signal S2 from the out-cell type touch device 120, and additionally, the first functional unit 130 outputs the output signal S3 corresponding to the touch-sensing signal S1 from the in-cell type optical touch device 110 to a computer PC.

When the interactive display panel 100 is physically touched through fingers or other stylus that cannot be sensed by the in-cell type touch device 110, only the touch-sensing signal S2 is generated and transmitted to the second functional unit 140. The touch-sensing signal S2 is inputted to the second functional unit 140 from the third input port IP3 and is then transmitted to the second input port IP2 of the first functional unit 130. Under this condition, the first functional unit 130 only receives the touch-sensing signal S2 from the out-cell type touch device 120, and additionally, the first functional unit 130 outputs the output signal S3 corresponding to the touch-sensing signal S2 from the out-cell type touch device 120 to the computer PC. In this embodiment, the first functional unit 130 is capable of judging whether the touch-sensing signal S1 is received thereby and outputting the output signal S3 correctly. Accordingly, priority of the touch-sensing signal S1 and S2 can be determined by the first functional unit 130 easily.

Referring to the light pen, it is a pen-based pointer with a light source, and includes a switch to turn on or turn off its light. The position of this switch could be placed on the outside or the inside of the pen's barrel. In one embodiment, the switch is connected with a pen tip, and the light is launched when the light pen is exerted against the display surface of the touch screen system. When a light pen may be used in writing operating mode, an effective operation of the light pen is to distinguish the user is simply hovering (false touch) or touched actually (true touch). For instance, the light pen is actually touched on the display area during writing, and the light pen is turned on and radiated. While the user's pen is lifted off the display surface of the touch screen system while writing, the light pen is turn off and extinguished. In other embodiment, the light pen or optical stylus have two terminals, one is used for radiating light to activate optical touch-sensing electrodes, and the other is used for input sensed by the out-cell type touch device.

By integration of the out-cell type touch panel and the in-cell type optical touch display panel, it is more convenient that users can operate the interactive display of this application by fingers and optical stylus. Users may operate the interactive display of this application by fingers of one hand and optical stylus held by another hand simultaneously. Alternatively, users may operate the touch screen system of this application by only one stylus to achieve optical and non-optical inputs.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch screen system, comprising:
   an in-cell type optical touch device for displaying images and receiving a light signal;
   an out-cell type touch device for sensing a finger or a non-optical stylus, the out-cell type touch device being disposed on an outer surface of the in-cell type optical touch device;
   a first functional unit electrically connected with the in-cell type optical touch device, the first functional unit converting an analog sensing signal received by the in-cell type optical touch device into a first electrical signal;

a second functional unit electrically connected with the out-cell type touch panel, an object-sensing signal generated from the out-cell type touch panel being processed by the second functional unit to generate a second electrical signal; and a third functional unit electrically connected with the first functional unit and the second functional unit to analyze the first electrical signal and the second electrical signal and generate valid output signals, wherein the valid output signals comprise both a light spot location and an object touch location detected by the touch screen system, the third functional unit outputs a valid output signal converted from the first electrical signal by the first functional unit, when only the first functional unit outputs the first electrical signal;

the third functional unit outputs a valid output signal converted from the second electrical signal by the second functional unit, when only the second functional unit outputs the second electrical signal; and the third functional unit outputs a valid output signal converted only from the first electrical signal, when both the first functional unit outputs the first electrical signal and the second functional unit outputs the second electrical signal.

2. The touch screen system according to claim 1, wherein the in-cell type optical touch device is a liquid crystal device having optical sensors embedded therein.

3. The touch screen system according to claim 1, wherein the out-cell type touch device comprises a resistive type touch panel, a surface-wave type touch panel, a capacitive type touch panel or an electromagnetic type touch panel.

4. The touch screen system according to claim 1, wherein the first functional unit and the third functional unit are configured in a first logic device and the second functional unit is configured in a second logic device.

5. The touch screen system according to claim 1, wherein the first functional unit, the second functional unit, and the third functional unit are configured in three different logic devices.

6. The touch screen system according to claim 1, wherein the out-cell type touch device is a capacitive or resistive sensing film laminated on the in-cell type optical touch device.

7. The touch screen system according to claim 1, further comprising an light pen with a light source being configured to output a light signal to the touch screen system.

8. A touch screen system, comprising:

a light pen having optical source for providing a light;

a monitor for sensing at least one of the light and a stylus impinging on a display area, the monitor providing an output representative of one location of the light or the stylus on the display area; and an operator configured to process a first electrical signal converted from light and a second electrical signal sensed from stylus, wherein the operator generates a set of position coordinates associated with the first electrical signal when the monitor only senses a light, the operator generates a set of position coordinates associated with the second electrical signal when the monitor only senses a stylus, and the operator generates a set of position coordinates only associated with the first electrical signal when the monitor senses both a light and a stylus.

9. The touch screen system according to claim 8, wherein the monitor has an addressable pixel array in a first substrate, and a plurality of optical sensors arranged in the addressable pixel array.

10. The touch screen system according to claim 9, wherein the optical sensor is driven by a scan line which is associated with the pixel structures.

11. The touch screen system according to claim 8, wherein the monitor comprises a first substrate, a second substrate and an electro-optic medium disposed between the first substrate and the second substrate.

12. The touch screen system according to claim 8, wherein the monitor comprises at least one detector selected from one of a resistive type touch panel, a surface-wave type touch panel, a capacitive type touch panel or an electromagnetic type touch panel.

13. The touch screen system according to claim 8, wherein the light is launched from the light pen when the pen is exerted against the display area.

* * * * *